United States Patent
Beard

(12) 
(10) Patent No.: US 6,914,566 B2
(45) Date of Patent: Jul. 5, 2005

(54) BALL GRID ARRAY ANTENNA

(75) Inventor: Paul Beard, Milpitas, CA (US)

(73) Assignee: Cypress Semiconductor Corp., San Jose, CA (US)

( * ) Notice: Subject to any disclaimer, the term of this patent is extended or adjusted under 35 U.S.C. 154(b) by 59 days.

(21) Appl. No.: 10/147,827

(22) Filed: May 17, 2002

(65) Prior Publication Data

US 2002/0171591 A1 Nov. 21, 2002

Related U.S. Application Data

(60) Provisional application No. 60/291,721, filed on May 17, 2001.

(51) Int. Cl.[7] .................................................. H01Q 1/24
(52) U.S. Cl. ............................... 343/702; 343/700 MS; 343/895
(58) Field of Search ........................ 343/700 MS, 866, 343/895, 795, 793, 741, 702, 873; H01Q 1/24

(56) References Cited

U.S. PATENT DOCUMENTS

| | | | |
|---|---|---|---|
| 5,185,613 A | * | 2/1993 | Whatmore et al. ......... 343/909 |
| 5,450,090 A | * | 9/1995 | Gels et al. ............ 343/700 MS |
| 5,585,807 A | * | 12/1996 | Takei .................. 343/700 MS |
| 6,031,496 A | | 2/2000 | Kuittinen et al. ............ 343/702 |
| 6,046,707 A | | 4/2000 | Gaughan et al. ............ 343/895 |
| 6,201,403 B1 | | 3/2001 | Rollin et al. ................ 324/765 |
| 6,297,551 B1 | | 10/2001 | Dudderar et al. ........... 257/723 |
| 6,563,464 B2 | * | 5/2003 | Ballantine et al. ... 343/700 MS |
| 6,805,493 B2 | * | 10/2004 | Igl et al. ....................... 385/88 |

* cited by examiner

*Primary Examiner*—Hoanganh Le
(74) *Attorney, Agent, or Firm*—Marger Johnson & McCollom, P.C.

(57) ABSTRACT

An antenna for a wireless communications device may be configured in a variety of shapes. The antenna is not limited to a two dimensional space, but may incorporate conductive antenna elements from an integrated circuit package, a circuit board to which the integrated circuit package mounts, and signal conducting connecting means between the integrated circuit package and the circuit board.

46 Claims, 13 Drawing Sheets

BALL GRID ARRAY ANTENNA

CROSS REFERENCE TO RELATED APPLICATIONS

This application claims the benefit of U.S. Provisional Application No. 60/291,721, filed May 17, 2001, which is hereby incorporated by reference.

FIELD OF THE INVENTION

The present invention generally relates to the field of wireless data communications, and particularly, to an antenna for a wireless data communications device.

BACKGROUND OF THE INVENTION

Current wireless communications devices include a radio incorporated on an integrated circuit chip. Antennas are used to transmit and receive the wireless signals. Antennas are implemented as conductive lengths of material having a variety of shapes to optimize reception and transmission properties. As a general rule, antenna lengths range from a half wavelength to under one tenth wavelength of the transmitted or received signal, depending upon the antenna configuration and the level of acceptable performance. The wavelength λ is determined for a given frequency f by the formula c=fλ, where c is the speed of light, approximately $3 \times 10^8$ m/s. For a 2.4 GHz signal, as used in Bluetooth and IEEE 802.11 wireless standards, λ=12.5 cm. Thus, for a 2.4 GHz signal transmitted from or received by a dipole antenna, maximum transmission and reception capabilities are achieved when the antenna length is an odd multiple of the received signal's quarter wavelength (λ/4), or 3.125 cm. Because of capacitive end effects of the antenna, the actual antenna length usually has optimal performance at about 95% of the length of a quarter wave length of the received or transmitted signal. Space must be found to accommodate the antenna and allow for adequate transmission and reception.

Current wireless devices have certain deficiencies. One deficiency in current devices is inefficient use of available space in the incorporation of an antenna. For example, there are unused areas in the wireless device chip packages, the circuit boards to which they mount, and the space between the chip packages and the circuit board which is underutilized. Furthermore, to generate a separate antenna element which is added to the wireless device increases the volume of the device. Thus, wireless communications devices are not as compactly made as they could be. Additionally, this adds to the total weight of the wireless device which may burden a user who carries one for an extended period of time.

Another deficiency is the manufacturing cost of portable wireless devices. Incorporating an antenna in current devices which also package a radio and baseband adds an additional step in the manufacturing process which increases costs. Although per unit costs of wireless devices may not be very high, minor cost savings on a per unit basis add up in the context of economies of scale. This is true for the manufacturer which produces large numbers of units as well as organizations which use many such devices.

Therefore, it would be desirable to have antennas which reduce the size and manufacturing cost of wireless communications devices in a wireless local area network.

SUMMARY OF THE INVENTION

Accordingly, the present invention is directed to a method for making antenna configurations and constructions that provide for reliable wireless communications in a compact device that saves on manufacturing costs. Additionally, the present invention is directed to an apparatus which utilizes this antenna.

In a first aspect of the present invention, the interconnection elements between the integrated circuit (IC) package and the circuit board to which the IC package mounts are used to provide part or all of the antenna length. The interconnection elements may be arranged to form various shapes to improve the radiation and pick up patterns of the antenna. The interconnection elements may be input/output pins, solder balls, conductive paste, and the like. The antenna may be incorporated into a single package with the radio and baseband. Loop, patch, dipole, and other antenna forms may be employed.

In a second aspect of the present invention, the antenna is formed entirely within either the circuit board or the IC chip package.

In a third aspect of the present invention, the antenna is formed entirely from an electrically conductive material, such as solder. The manufacture of the antenna may be accomplished by various methods.

Allowing interconnection elements to form part of the antenna permits a secondary use of a necessary element and reduces the volume of the resulting device. It also reduces the number of manufacturing steps and the number of layers in the device. This reduces processing costs, material costs, and labor costs.

It is to be understood that both the forgoing general description and the following detailed description are exemplary and explanatory only and are not restrictive of the invention as claimed. The accompanying drawings, which are incorporated in and constitute a part of the specification, illustrate an embodiment of the invention and together with the general description, serve to explain the principles of the invention.

BRIEF DESCRIPTION OF THE DRAWINGS

The numerous advantages of the present invention may be better understood by those skilled in the art by reference to the accompanying figures in which.

DETAILED DESCRIPTION OF THE INVENTION

Reference will now be made in detail to the presently preferred embodiments of the invention, examples of which are illustrated in the accompanying drawings.

Referring generally now to FIGS. 1 through 18, exemplary embodiments of the present invention are shown. The antenna of the present invention is connected or connectable to a radio and may be presumed present where it has not been shown. A baseband connects or is connectable to the radio.

The present invention relates to antennas for wireless communications devices. The wireless communications devices may include IEEE 802.11, HomeRF, Bluetooth, and other devices using the 2.4 GHz Industrial, Scientific, and Medical Band. The devices may operate at frequencies below or above the ISM band. More specifically, the present invention relates to antennas which may be formed, wholly or partly, under, on, or within an integrated circuit package, such as a ball grid array. The antennas may be constructed in numerous shapes and numerous orientations. Antenna lengths may be set for the center frequency of the operating band. A plurality of antenna elements may be used to more precisely capture information contained in sub bands within the operating band. The antennas may be pivotable, flexible, rigid, adhesive, solderable, or stationary as long they provide for reliable communications.

The antenna of the present invention utilizes components from an integrated circuit, interconnection elements for mounting the integrated circuit to a circuit board, and/or the circuit board. The antenna need not be formed from the interconnection elements, such as solder balls. The circuit board may be a printed circuit board. Multiple layers in the IC and/or the circuit board may be used to form the antenna. The antenna may be formed entirely within either the IC package or the circuit board. Forming the antenna entirely within the circuit board or from the circuit board and the interconnection elements may offer a more rugged location for the antenna than inside the IC package. Using the IC package may provide for better space utilization in the device and allow better control over the electrical characteristics of the antenna through material and process matching. Using the circuit board, the IC package, and the interconnection elements may provide for optimal usage of device space.

Although the present invention seeks to utilize preexisting components, it may also be practiced with add on elements to form the antenna or a portion of the antenna. The add on elements may include a wire like length of conductive material or a heat sink.

A variety of antenna shapes and structures may be realized through the present invention.

Figure 1:
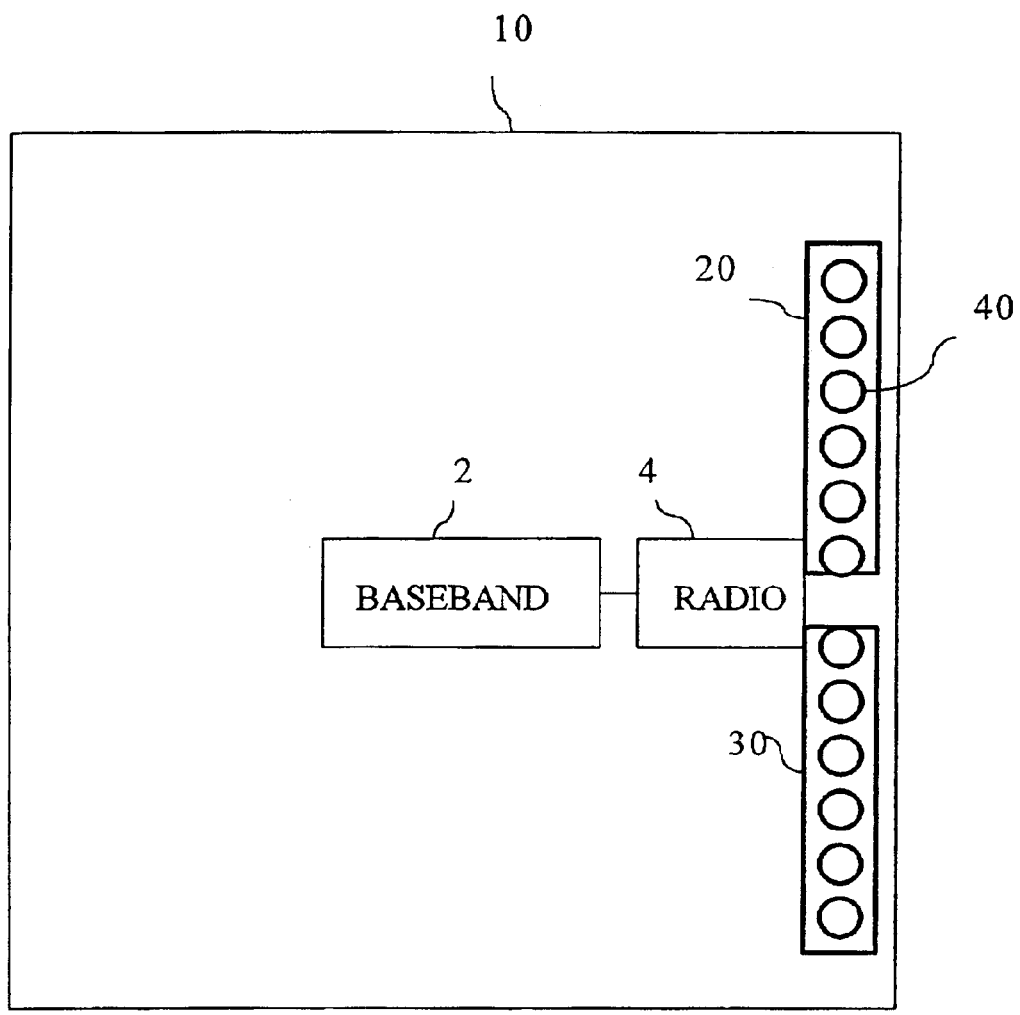
FIG. 1 illustrates a half wave dipole antenna of the present invention.

FIG. 1 shows a half wavelength dipole antenna formed of two quarter wavelength conductive segments 20, 30. Each quarter wavelength segment 20, 30 is coupled to a radio 4 which is communicatively coupled to a baseband 2. Each conductive segment may be formed from solder balls or other interconnection elements 40 or other conductive elements located beneath an integrated circuit package 10. The area of the integrated circuit package and the circuit board where the antenna is disposed may be made so as to reduce or eliminate conductive elements which may interfere with the receipt or transmission of radio frequency energy. Also, it may be desirable to place the antenna structure 20, 30 at or near the edge of the circuit board to maximize the antenna's placement in free space. The solder balls 40 may be placed so as to be in contact with adjacent solder balls or may be conductively interconnected through a conductive paste or solder. The solder balls 40 may be melted to form a continuous conductive length through the application of heat. The solder balls 40 may be electrically connected to each other through conductive traces formed in the circuit board and/or integrated circuit package. The two conductive segments 20, 30 may be orient in a manner other than end to end. Because of space considerations in the layout of interconnection elements, an IC chip, and/or a circuit board, the segments 20, 30 may be oriented at an angle such as 90 degrees, 135 degrees, 45 degrees, etc.

Figure 2:
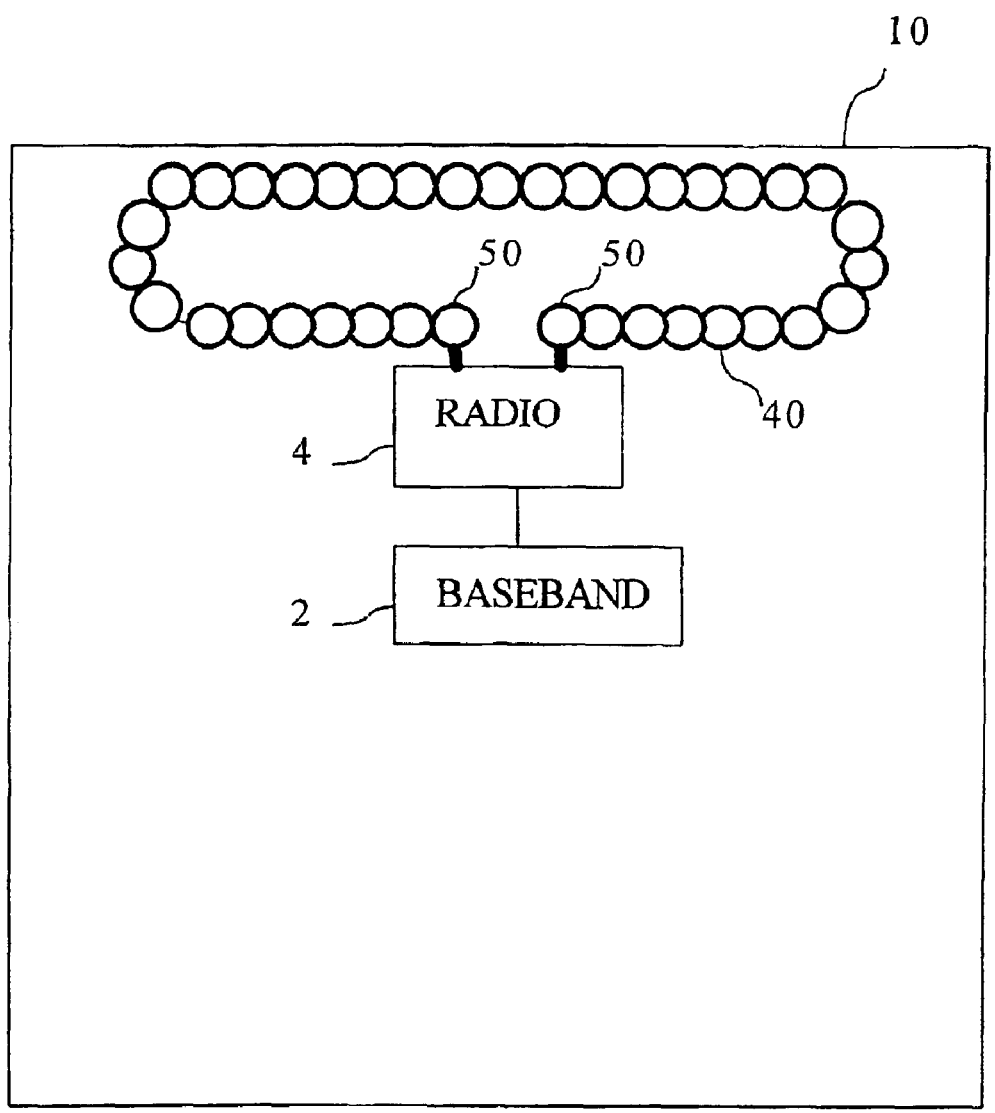
FIG. 2 illustrates a folded dipole antenna of the present invention.

FIG. 2 illustrates a folded dipole antenna formed of solder balls 40, 50 under integrated circuit package 10. Two solder balls 50 may be used as feed points for the antenna.

Figure 3:
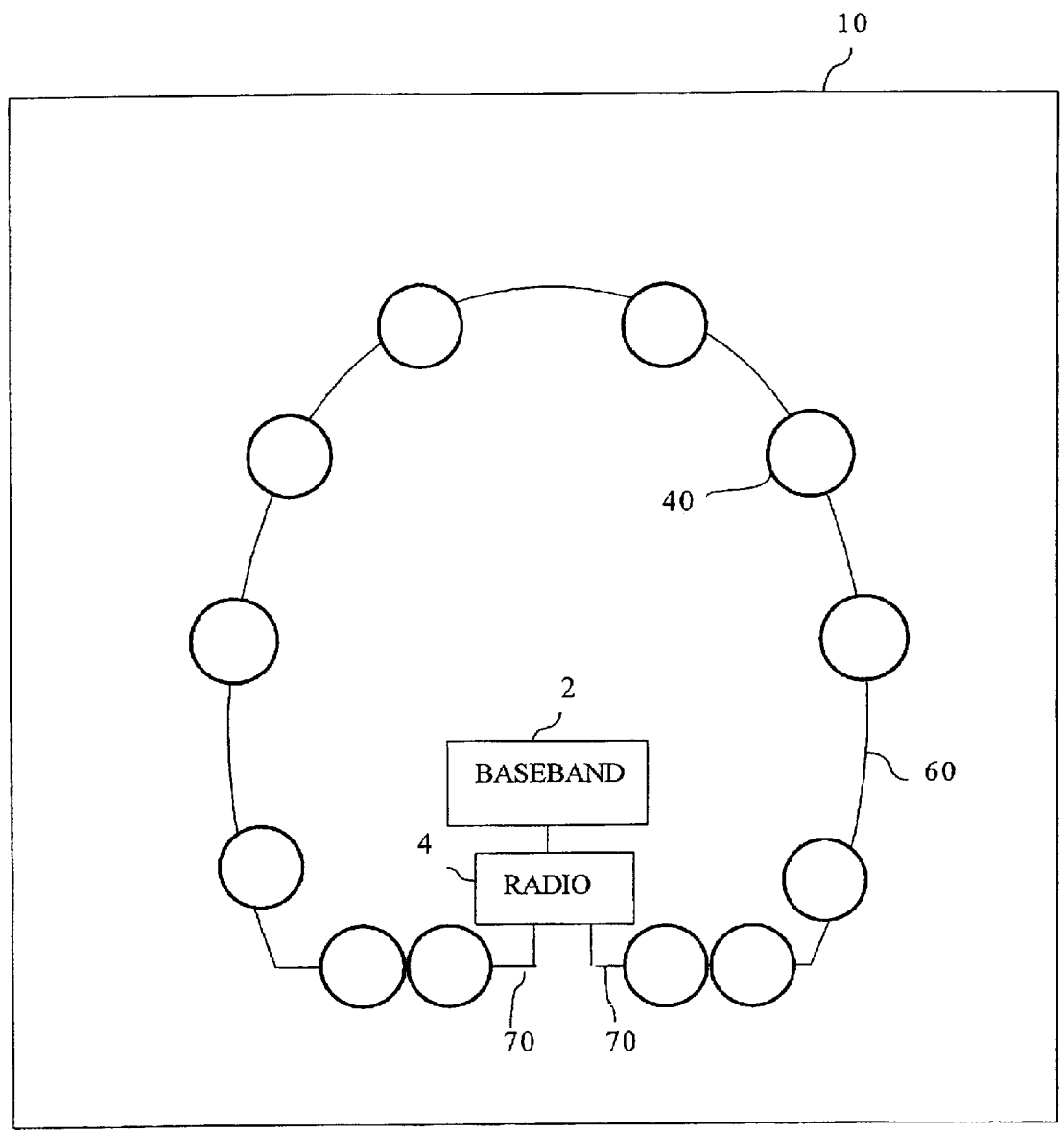
FIG. 3 illustrates a loop antenna of the present invention.

FIG. 3 illustrates a loop antenna formed on solder balls 40 and conductive traces 60 which are disposed with the integrated circuit package and/or on or within the circuit board to which the integrated circuit package mounts. Feed points 70 are shown as being formed from the conductive traces. The present invention is not limited to a single loop antenna, but may be practiced with a double loop, triple loop, or other types of loop antenna, including fractional loop antennas such as 1 and ¾ loop antennas.

Figure 4:
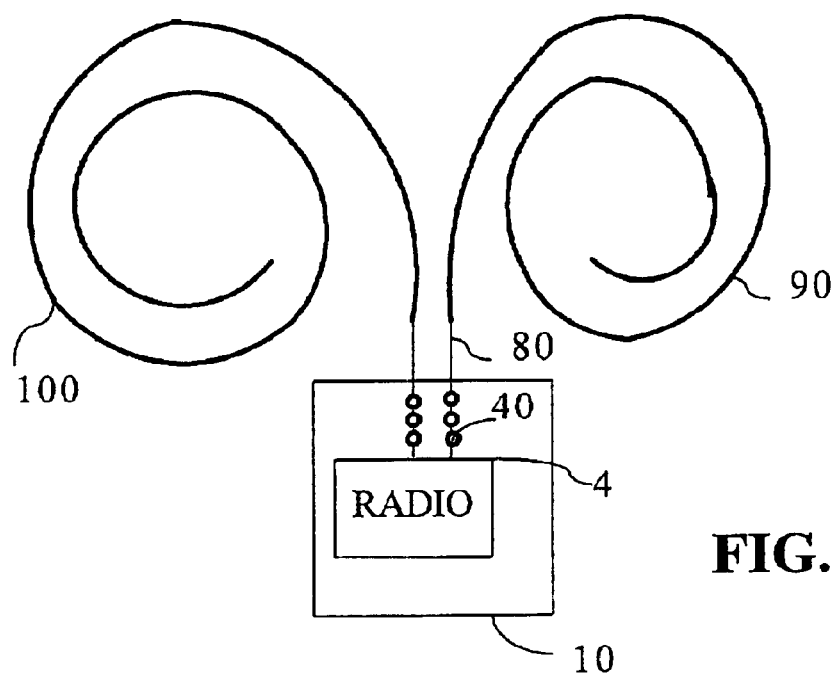
FIG. 4 illustrates a double spiral antenna of the present invention.
Figure 5:
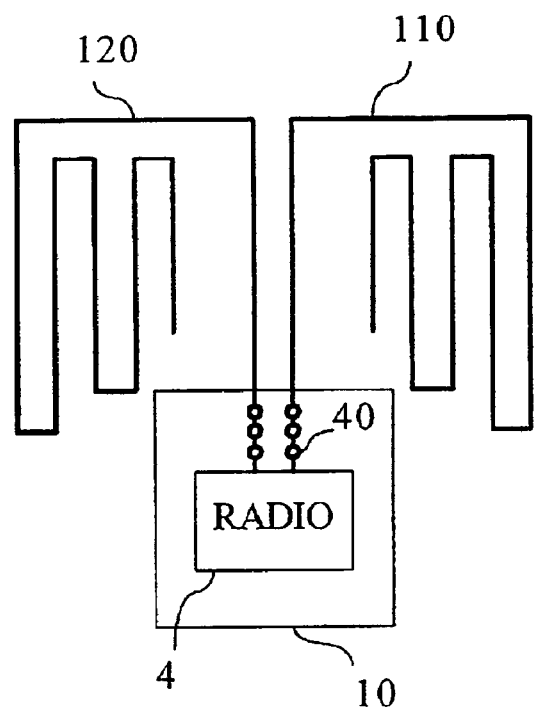
FIG. 5 illustrates a double square wave antenna of the present invention.
Figure 6:
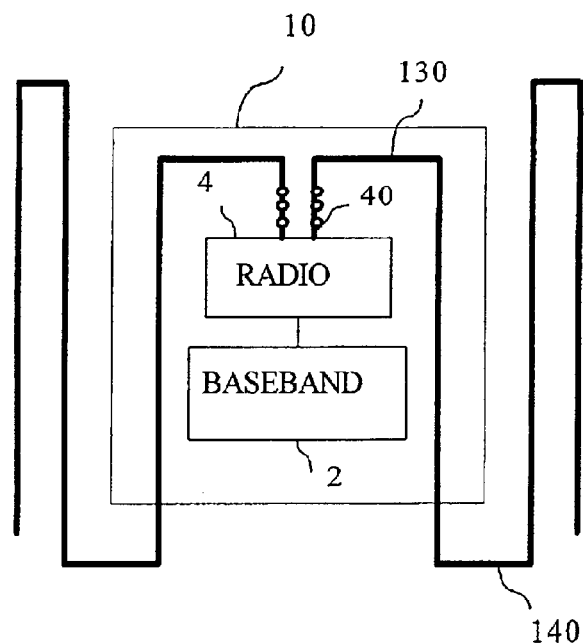
FIG. 6 illustrates a variant of the antenna of FIG. 5.
Figure 6A:
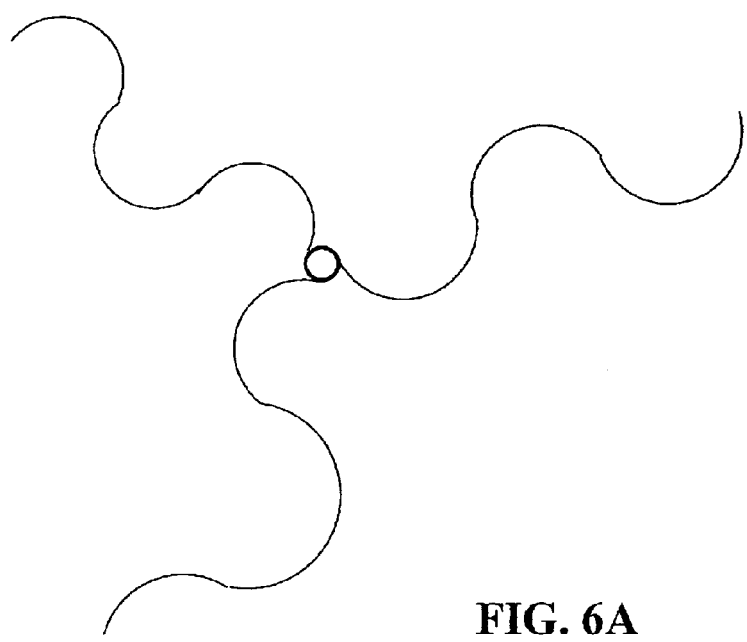
FIG. 6A illustrates a star shaped antenna having serpentine arms.

FIGS. 4–6A illustrate double antennas that are extensively formed outside the integrated circuit package boundary 10. FIG. 4 shows a double spiral antenna formed of two spirals 90, 100 and joined to the integrated circuit package 10 through traces 80 which may be formed from a combination of circuit board traces, interconnection elements, such as input/output pins or solder balls, and integrated circuit package traces. FIGS. 5 and 6 show double square wave antennas. FIG. 5 shows the inward ends of the antenna forming increasingly shorter lengths in proximity to the other antenna. Other variations include constant lengths and increasingly longer lengths in proximity to the other antenna. An antenna shape may include alternating rectilinear and curved portions. The portion 130 of the antenna in FIG. 6, as well as analogous portions of the antennas in FIGS. 4 and 5, may be formed of interconnection elements, IC traces, or circuit board traces, or a combination of these, whereas portion 140 is formed of circuit board traces or an external conductive attachment. The external conductive attachment may be a surface mounted antenna chip or a conductive element which is flexibly bound and largely insulated by a carrier material which has an adhesive side or mechanically attachable portion. The mechanically attachable portion may be attached through a solder bond. The mechanically attachable portable may be attached by means of a screw. One antenna may be a curved spiral and the other a square spiral. These drawing figures are illustrative of the present invention. Other variations of antenna patterns are within the spirit and scope of the present invention. FIG. 6A shows a star shaped antenna having serpentine arms. The arms may be two, three, four, five, or more in number. The arms may each have a sharp Z shape, a more gradual S shape, or may be straight line segments.

Figure 7:
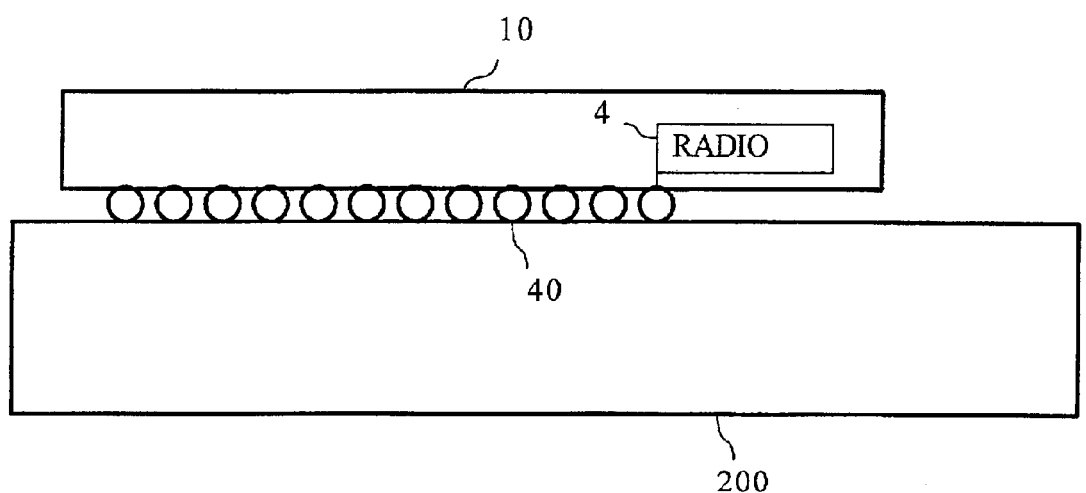
FIG. 7 illustrates a cross sectional view of an IC package mounted on a circuit board in which an antenna structure has solder balls as the primary component.
Figure 8:
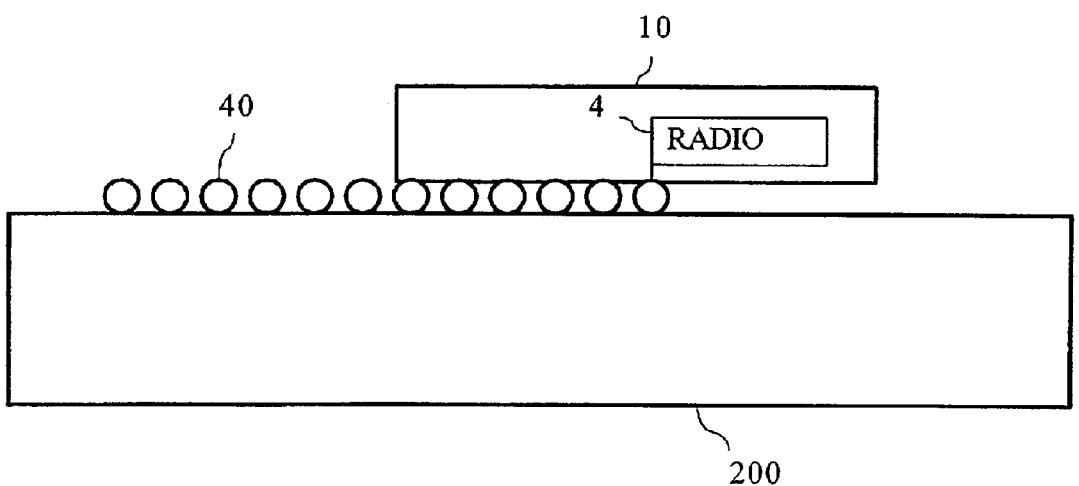
FIG. 8 illustrates a cross section view of an antenna structure which is a variant of FIG. 7.
Figure 9:
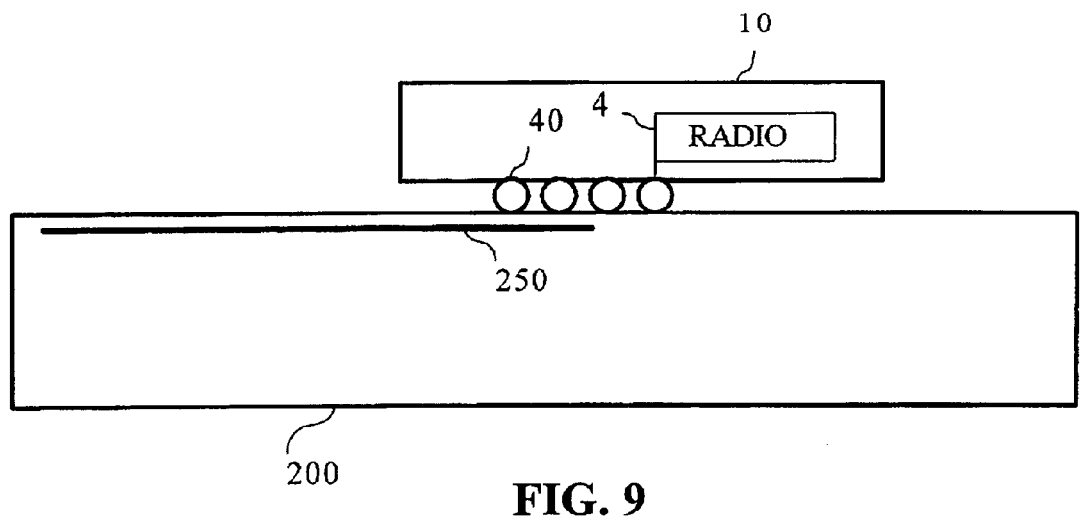
FIG. 9 illustrates a cross sectional view of an antenna formed from solder and a conductive trace in the printed circuit board.
Figure 10:
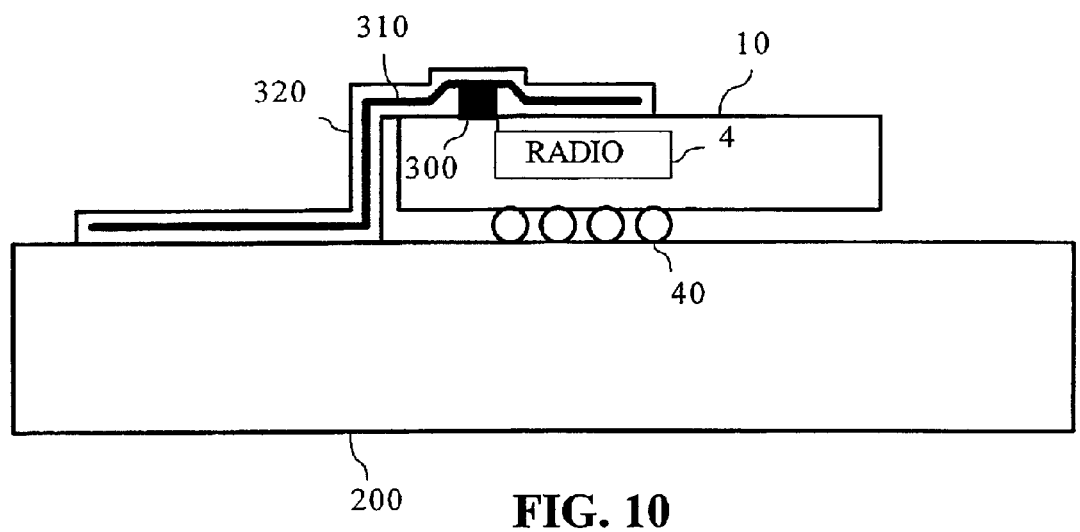
FIG. 10 illustrates a cross sectional view of an antenna formed in a flexible material which is attachably mounted to an integrated circuit package.
Figure 11:
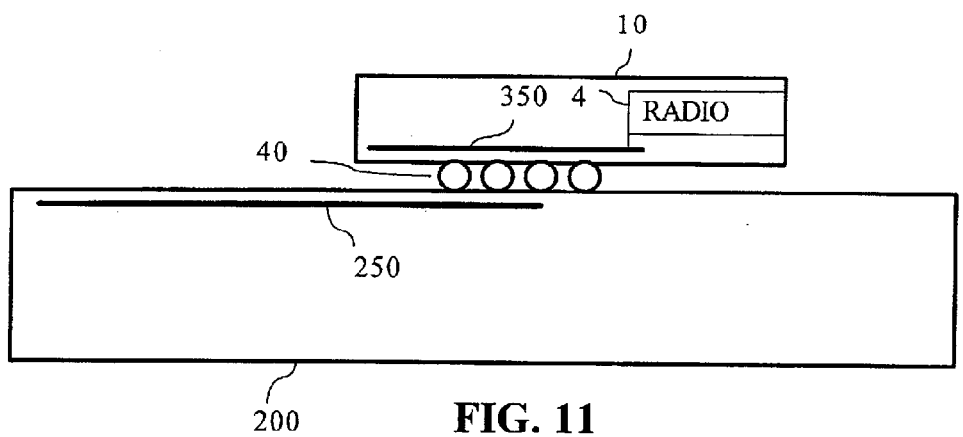
FIG. 11 illustrates a cross sectional view of an antenna formed from a conductive trace within the integrated circuit, the solder connecting means, and a conductive trace within the printed circuit board.
Figure 12:
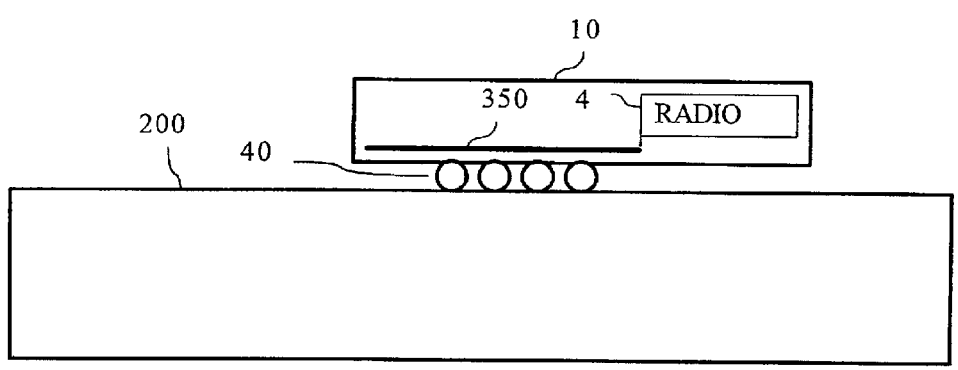
FIG. 12 illustrates a cross sectional view of an antenna formed from a conductive trace within the integrated circuit and the solder connecting means.

FIGS. 7–12 illustrate cross sectional views of an integrated circuit package 10 mounted upon a circuit board 200 through interconnection elements 40. The interconnection means may be input/output pins, solder balls, or another conductive material which serves to carry an electrical signal between the circuit board 200 and the integrated circuit 10. The interconnection elements 40 may include dummy input/output pins or dummy solder pads which connect to no circuitry within its IC chip package. Although not shown, the interconnection elements may be electrically joined to each other to form patterns by selective melting or bonding by solder, electrically conductive paste, etc. FIG. 7 shows an antenna formed on interconnection elements 40 which are either melted together or have a conductive adhesive material applied to them to form a sufficiently long continuous conductive path to serve as an antenna for the desired center frequency of transmission and reception. FIG. 8 shows an antenna formed from interconnection elements 40 which extend beyond the boundaries of the integrated circuit 10 attached to the antenna. FIG. 9 shows an antenna formed of interconnection elements 40 and conductive traces 250 formed within the circuit board 200. FIG. 10 shows an antenna 310 formed from a flexible conductive material, e.g., a tape on a reel, which is bound by an insulating material 320. This antenna may be attached to a top side of the integrated circuit 10 through a specially made conductive attachment point 300. The attachable antenna may be formed on a rigid circuit board which connects to attachment point 300. Alternatively, the conductive attachment point 300 may be formed on the circuit board 200. Also, the antenna may be formed on a bendable sufficiently rigid substrate so as to allow an orientation that is vertical or somewhat vertical to the plane of extension of the circuit board 200. The interconnection elements 40 may or may not be used to form part of this antenna. FIG. 11 shows conductive traces 350 of the integrated circuit package 10, the interconnection elements 40, and the conductive traces 250 all used to form an antenna. FIG. 12 shows only the conductive traces 350 of the integrated circuit package 10 and the interconnection elements 40 which form the antenna. Antennas mounted to the circuit board or the IC package may reduce manufacturing costs.

Figure 13A:
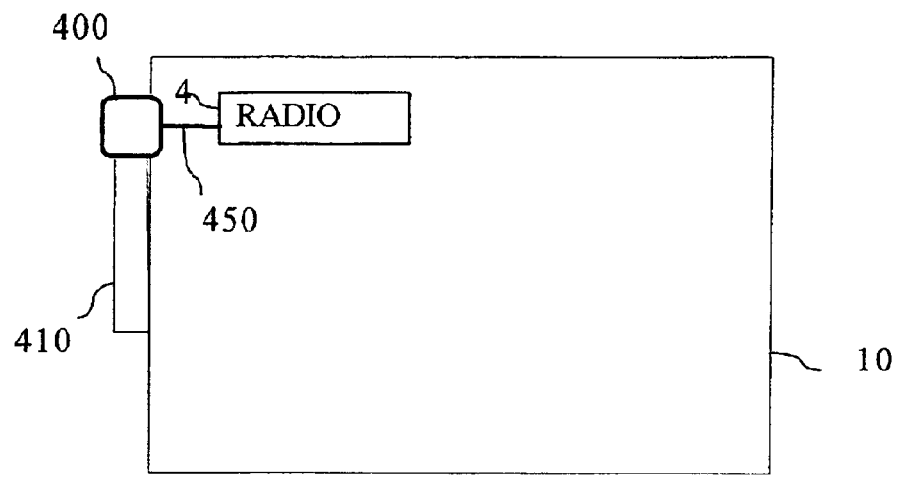
FIGS. 13A and 13B illustrate an antenna extendable from the integrated circuit package.
Figure 13B:
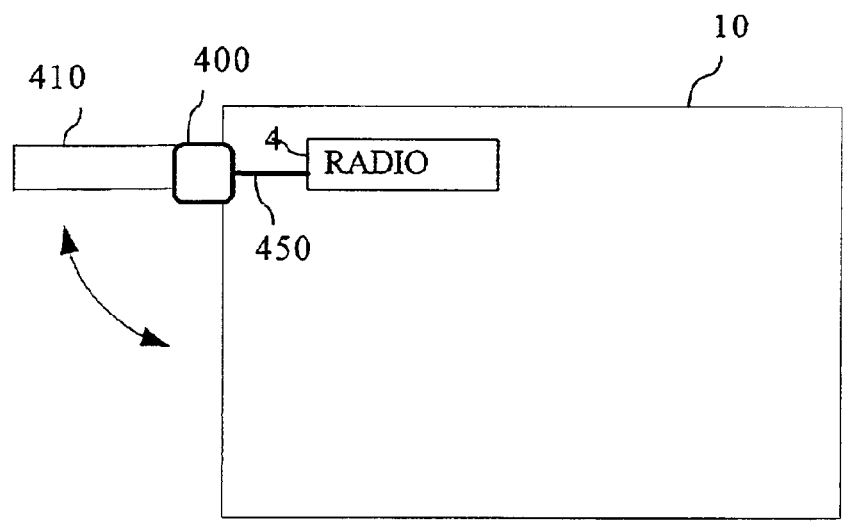

FIGS. 13A and 13B illustrate a pivotable antenna 450 which lies at the edge of an integrated circuit package 10 or circuit board. A conductive trace forms a portion of the antenna. As shown, the pivot joint 400 permits travel in a direction horizontal to a circuit board upon which the integrated circuit package is mounted. In an alternative embodiment, the antenna 450 may pivot vertically with respect to the circuit board. Other antenna elements may be provided within the integrated circuit package, through the interconnection elements, and/or within the circuit board. Instead of being pivotable, the antenna may be retractable. The antenna may also having a snapping action.

Figure 14A:
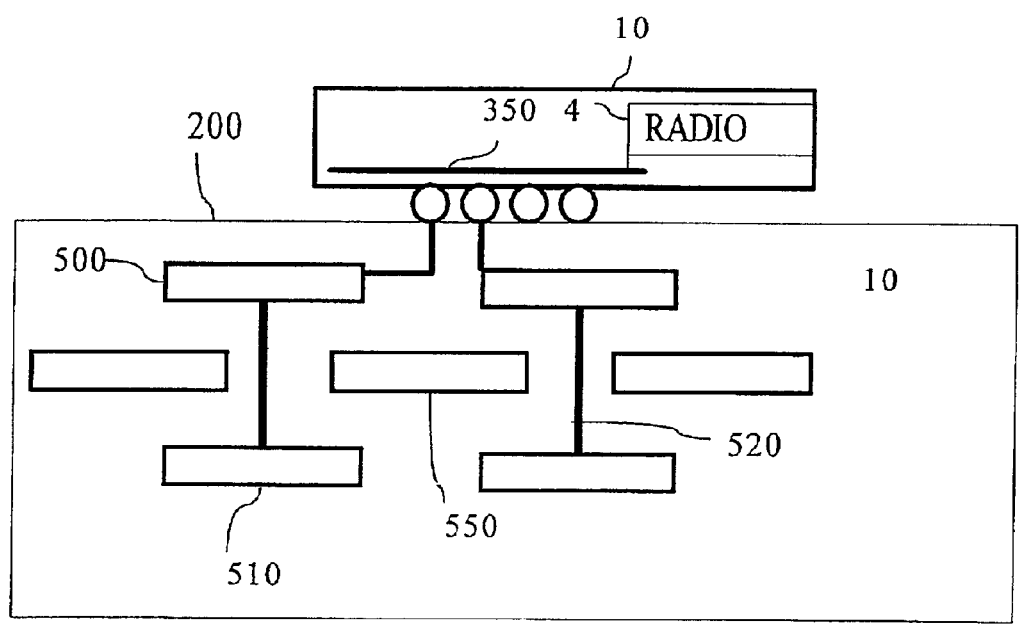
FIGS. 14A and 14B illustrate a patch antenna in a top view and a cross sectional view.
Figure 14B:
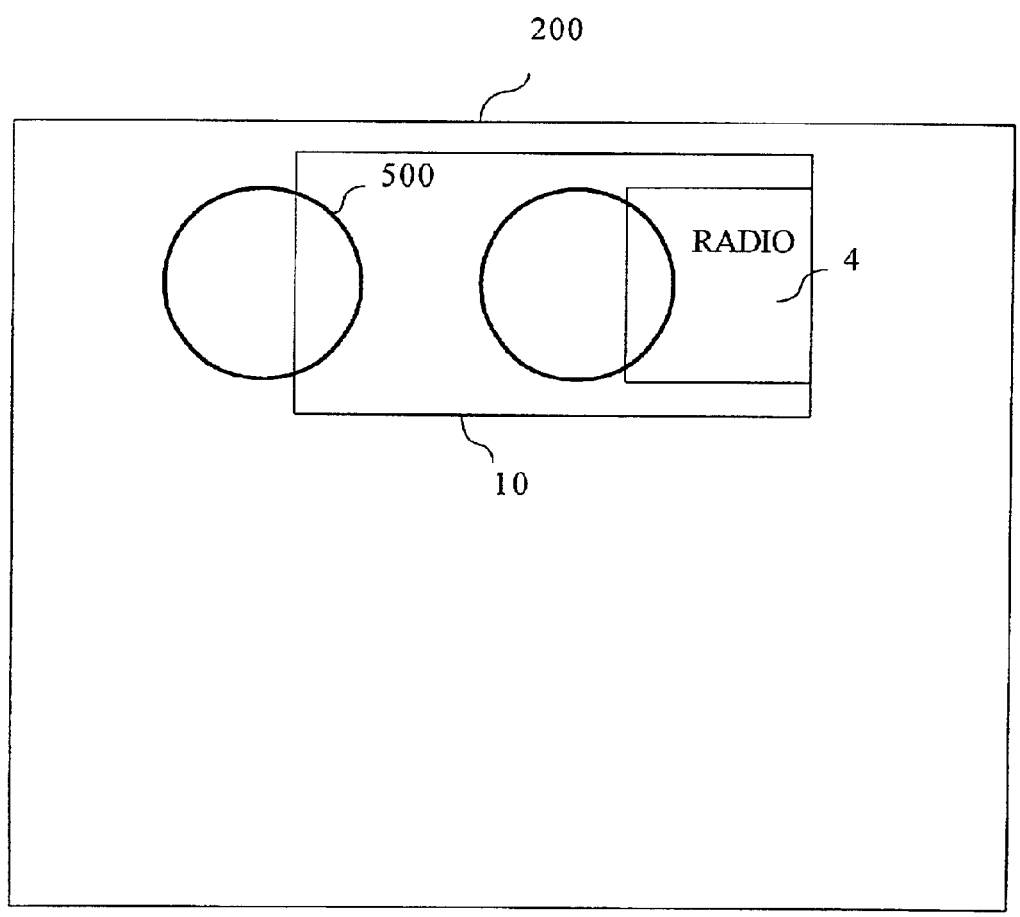
Figure 15:
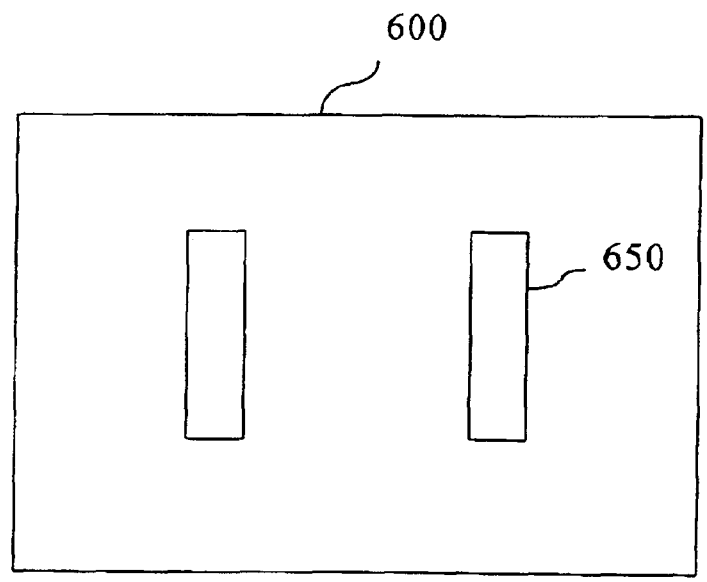
FIG. 15 illustrates a slot antenna.
Figure 16:
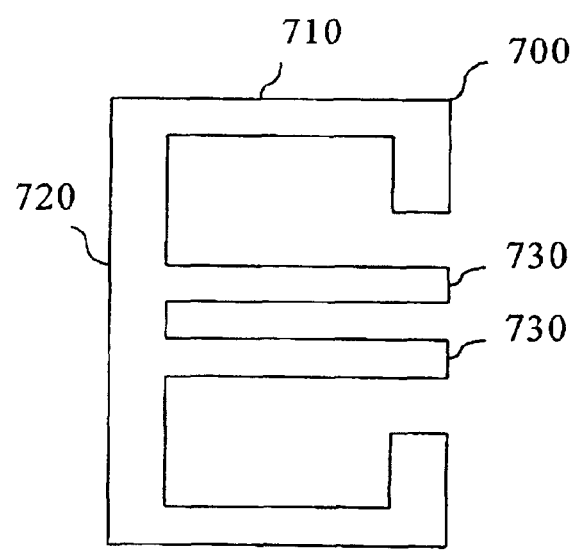
FIG. 16 illustrates a variation of an E or F shaped antenna.

Patch and microstrip antennas may be implemented by the present invention. FIGS. 14A and 14B illustrate a patch antenna 500. A patch antenna provides a low surface profile and may come in a variety of shapes and sizes. FIG. 14A shows the patch antenna elements 500 and 510 disposed in two different planes within circuit board 200 and sandwiching a ground plane 550. An electrical interconnection 520 connects the patch antennas of two planar levels through openings with the ground plane 500. The patch antennas 500 may be disposed beneath an integrated circuit package 10. The patch antennas may be disposed in a region of the circuit board 200 which has a minimal number of other conductive elements and/or has no integrated circuit packages or discrete components mounted on it to maximize RF signal reception and transmission. The patch antenna may also be realized using a single layer of the circuit board, interconnection elements, or IC package and may be a single element. FIG. 15 illustrates a slot or slotted patch antenna. FIG. 16 illustrates a variation of an E or F microstrip antenna.

Figure 17A:
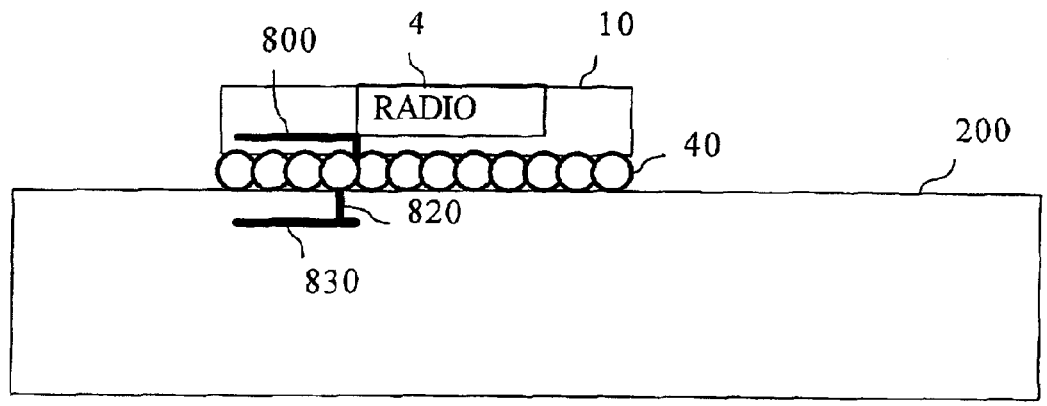
FIGS. 17A and 17B illustrate a helical antenna.
Figure 17B:
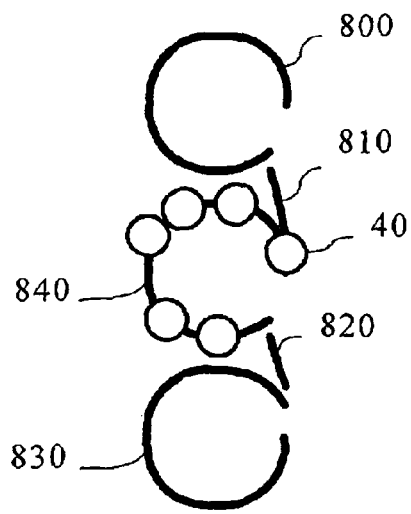

FIGS. 17A and 17B illustrate a helical antenna. The helical antenna elements may be formed entirely within either the integrated circuit package 10 or the circuit board 200. As shown in FIG. 17A, the helical antenna has three layers, a layer 800 within the integrated circuit package, a layer formed from the interconnection elements, and a layer 830 formed within the circuit board. As shown in FIG. 17B, the layers are interconnection to adjacent layers through electrically conductive connection elements (or vias) 810 and 820. FIG. 17B shows that the middle layer is formed from interconnection elements 40, which are themselves interconnected within the layer by conductive material 840. This conductive material may be conductive paste, solder, or traces formed on the surface of the circuit board and/or integrated circuit package. Alternatively, the helical antenna may be formed entirely within the IC chip package or entirely within the circuit board.

Other antennas, such as mechanically embedded antennas, Yagi antennas, and chip antennas, may be practiced with the present invention. The antennas may be designed to deflect RF energy from a user or may be designed to provide omnidirectionality of the transmitted signal. Multiple antennas may be placed on or proximate to the IC package and may be switchably selectable.

Figure 18:
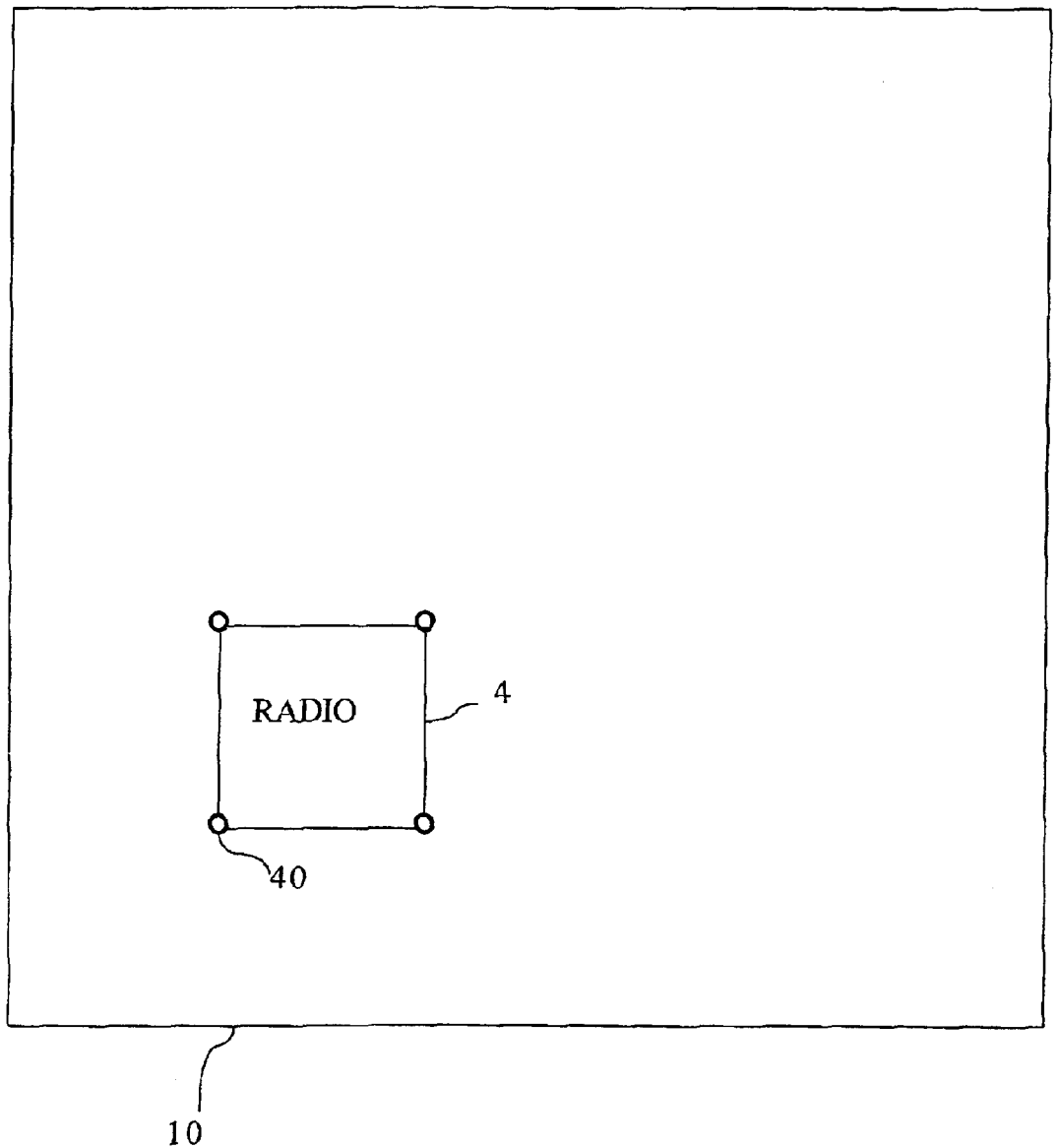
FIG. 18 illustrates an interconnection element itself which serves as an antenna.

FIG. 18 illustrates an embodiment in which an interconnection element 40 itself forms the antenna. FIG. 18 shows a distribution of such antennas to enhance reception/transmission. The interconnection element may be a solder ball, an input/output pin, an enhanced solder ball, an enhanced input/output pin, or some other conductive material. An enhanced interconnection element may include a pin from a mounting socket or some other attached material to increase the effective antenna length.

As an alternative embodiment, the antenna may be constructed in whole or in part from solder and/or other electrically conductive material that is adhesive, printable, patternable, sprayable, or meltable. The antenna may be entirely constructed from a length of solder and/or other electrically conductive material which is shaped into a desired pattern—serpentine, straight length, branched, etc. This process may entail melting the material or using a resist for patterning. Troughs having conductive surfaces or surfaces which collect and adhere flowable material may be disposed throughout or selectively dispersed on a circuit board or other suitable surface so as to collect and hold the liquefied conductive material before it hardens. The solder and solder balls when molten may cause a beneficial self centering effect on the integrated circuit package (e.g., BGA) through surface tension effects. Alternatively, the antenna may be formed by spraying an adhesive, electrically conductive material through a mask. The antenna, if formed from a length of solder and/or other electrically conductive material, may be disposed upon the circuit board or the IC chip package. The application of flowable materials, such as solder, to form the antenna needs to be well controlled because applying too much, too little, or irregularly to form the antenna may affect its radiation and pickup patterns from one manufactured antenna to the next. Precise control of the processing is important in manufacturing the antennas as well as the other components.

Various electrically conductive materials may be used to form the antenna. The antenna may be formed, at least in part, from a metal, such as copper, aluminum, nickel, bismuth, tungsten, silver, palladium, platinum, zinc, chromium, molybdenum, lead, antimony, tin, or gold, or a non-metallic conductive material, such as poly silicon. If solder material is used, it may contain two or more of the group consisting of lead, bismuth, tin, antimony, copper, silver, zinc, and indium and may be lead free, such as tin-silver solder or tin-indium solder. Different lengths of the antenna may be formed of different materials. For example, in the case where the antenna is partly formed in the integrated circuit, partly formed through interconnection elements, and partly formed in the circuit board upon which the integrated circuit chip is mounted, the antenna may have a polysilicon section, a solder material section, and a copper section to maximize space utilization in the device. Material characteristic matching may be applied to improve the antenna performance.

Dielectric material, such as a liquid epoxy resin, may be disposed or filled around the interconnection elements which form the antenna to reduce the overall length of the antenna since coating the antenna elements with a higher permittivity (i.e., dielectric) material helps capture RF energy for the antenna element. The dielectric material may be applied in flowable form by an applicator and then hardened by heat or other radiation. The dielectric material may be formed through resists which are patterned or etched. A consideration in selecting dielectric material of a certain permittivity is that the higher the permittivity, the more RF energy is reflected within the antenna and the more narrow banded the resulting antenna performance. Alternatively, the antenna may be formed on a dielectric substrate, such as ceramic.

The antenna of the present invention may be used in devices such as mobile phone handsets, personal data assistants, palmtops, pocket personal computers, printers, scanners, digital cameras, game consoles, MP3 players, wireless network access points, and the like.

It is believed that the present invention and many of its attendant advantages will be understood by the forgoing description. It is also believed that it will be apparent that various changes may be made in the form, construction and arrangement of the components thereof without departing from the scope and spirit of the invention or without sacrificing all of its material advantages. The form herein before described being merely an explanatory embodiment thereof. It is the intention of the following claims to encompass and include such changes.

What is claimed is:

1. An antenna for a wireless communications device, comprising:
   a first length formed from at least two interconnection elements between an integrated circuit package and a circuit board to which the integrated circuit package is mounted.
2. The antenna of claim 1, the at least two interconnection elements comprising at least two solder balls.
3. The antenna of claim 2, wherein the interconnection elements are electrically connected by being melted.
4. The antenna of claim 2, wherein the interconnection elements are electrically connected by an application of molten solder.
5. The antenna of claim 4, wherein the solder is lead free.
6. The antenna of claim 4, wherein the solder contains two or more of the group consisting of lead, bismuth, tin, antimony, copper, silver, zinc, and indium.
7. The antenna of claim 1, the at least two interconnection elements comprising at least two input/output pins.
8. The antenna of claim 1, further comprising a second length and a third length which connect to the first length to form the antenna.
9. The antenna of claim 8, wherein at least one of the second and third lengths is formed from a conductive trace within the integrated circuit package.
10. The antenna of claim 8, wherein at least one of the second and third lengths is formed from a conductive trace within the circuit board.
11. The antenna of claim 8, wherein at least one of the second and third lengths is formed on or in a structure which attaches to the integrated circuit package.
12. The antenna of claim 11, wherein the structure is flexible.
13. The antenna of claim 11, wherein the structure is bendable.
14. The antenna of claim 11, wherein the structure is rigid.
15. The antenna of claim 11, wherein the structure is attached by a solder connection.
16. The antenna of claim 11, wherein the structure is adhesively attached.
17. The antenna of claim 11, wherein the structure is mechanically attached.
18. The antenna of claim 8, wherein at least one of the second and third lengths is formed on or in a structure which attaches to the circuit board.
19. The antenna of claim 18, wherein the structure is flexible.
20. The antenna of claim 18, wherein the structure is bendable.
21. The antenna of claim 18, wherein the structure is rigid.
22. The antenna of claim 18, wherein the structure is attached by a solder connection.
23. The antenna of claim 18, wherein the structure is adhesively attached.
24. The antenna of claim 18, wherein the structure is mechanically attached.
25. The antenna of claim 1, wherein the integrated circuit package is a ball grid array.
26. The antenna of claim 8, wherein each of the first, second, and third lengths includes one or more solder balls.
27. The antenna of claim 8, wherein dielectric material is disposed around at least one of the first, second, and third lengths.
28. The antenna of claim 8, wherein the first, second, and third lengths are disposed at different heights with respect to the circuit board.
29. The antenna of claim 1, a first one and a second one of the at least two interconnection elements independently configured to attach the integrated circuit package to the circuit board.
30. The antenna of claim 1, the first length arranged substantially parallel to the integrated circuit package and time circuit board.
31. The antenna of claim 1, a first one of the at least two interconnection elements substantially the same as a second one of the at least two interconnection elements.

32. A method of manufacturing a radio chip package, comprising:

mounting a radio upon a chip of a ball grid array package;

forming a series of solder balls from said ball grid array package suitable for creating an antenna; and connecting said radio to said series, wherein said radio is capable of improved transmission and reception via said series.

33. A method of manufacturing an antenna, comprising:

processing a mounting surface to make it receptive to an electrically conductive material;

applying the electrically conductive material to the mounting surface in a liquefied form; and hardening the electrically conductive material applied to the mounting surface to form an antenna.

34. The method of manufacturing of claim 33, wherein the antenna forms a pattern.

35. The method of manufacturing of claim 34, wherein the electrically conductive material consists of solder in its entirety.

36. The method of manufacturing of claim 35, wherein the antenna pattern is connected to a radio.

37. The method of manufacturing of claim 33, wherein the electrically conductive material includes interconnection elements from an integrated circuit package.

38. The method of manufacturing of claim 37, wherein the interconnection elements are solder balls.

39. An antenna for a wireless communications device, comprising:

a first length having an end which conductively attaches to radio frequency processing circuitry;

a second length having an end which conductively attaches to the other end of the first length; and a third length having an end which conductively attaches to the other end of the second length, wherein the first, second, and third lengths are formed in parallel planes which are at different heights with respect to the major planar extension of an integrated circuit package and a circuit board to which the integrated circuit package is mounted.

40. The antenna of claim 39, wherein the antenna is a helical antenna.

41. The antenna of claim 40, wherein the antenna is entirely formed within the integrated circuit package.

42. The antenna of claim 40, wherein the antenna is entirely formed within the circuit board.

43. The antenna of claim 39, wherein the antenna is a patch antenna.

44. The antenna of claim 39, wherein the antenna is a microstrip antenna.

45. The antenna of claim 39, wherein one of the first, second, and third lengths is formed from two or more interconnection elements between an integrated circuit package and a circuit board to which the integrated circuit package is mounted.

46. The antenna of claim 39, wherein the antenna includes solder balls.

* * * * *

UNITED STATES PATENT AND TRADEMARK OFFICE
CERTIFICATE OF CORRECTION

| | |
|---|---|
| PATENT NO. | : 6,914,566 B2 |
| APPLICATION NO. | : 10/147827 |
| DATED | : July 5, 2005 |
| INVENTOR(S) | : Beard |

It is certified that error appears in the above-identified patent and that said Letters Patent is hereby corrected as shown below:

At column 8, line 64, please replace "time circuit board" with --the circuit board--

Signed and Sealed this

Nineteenth Day of December, 2006

JON W. DUDAS
*Director of the United States Patent and Trademark Office*